United States Patent
Khare et al.

(10) Patent No.: US 6,893,979 B2
(45) Date of Patent: May 17, 2005

(54) METHOD FOR IMPROVED PLASMA NITRIDATION OF ULTRA THIN GATE DIELECTRICS

(75) Inventors: Mukesh V. Khare, White Plains, NY (US); Christopher P. D'Emic, Ossining, NY (US); Thomas T. Hwang, Wappingers Falls, NY (US); Paul C. Jamison, Hopewell Junction, NY (US); James J. Quinlivan, Essex Junction, VT (US); Beth A. Ward, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 09/809,663

(22) Filed: Mar. 15, 2001

(65) Prior Publication Data

US 2002/0130377 A1 Sep. 19, 2002

(51) Int. Cl.[7] .................... H01L 21/31; H01L 21/469
(52) U.S. Cl. .................... 438/769; 438/775; 438/786
(58) Field of Search ................ 438/786, 775, 438/774, 777, 778, 779, 780, 781, 782, 783, 784, 785, 769, 585

(56) References Cited

U.S. PATENT DOCUMENTS

| 4,980,307 | A | * | 12/1990 | Ito et al. .................... 437/40 |
| 5,578,848 | A | | 11/1996 | Kwong et al. .............. 257/296 |
| 5,674,788 | A | | 10/1997 | Wristers et al. ............. 437/239 |
| 5,861,651 | A | | 1/1999 | Brasen et al. ............... 438/253 |
| 5,880,040 | A | | 3/1999 | Sun et al. .................... 257/411 |
| 6,015,997 | A | * | 1/2000 | Hu et al. .................... 257/412 |
| 6,017,791 | A | | 1/2000 | Wang et al. ................. 438/253 |
| 6,087,236 | A | | 7/2000 | Chau et al. .................. 438/301 |
| 6,096,656 | A | * | 8/2000 | Matzke et al. .............. 438/702 |
| 6,100,160 | A | * | 8/2000 | Hames ........................ 438/424 |
| 6,110,842 | A | | 8/2000 | Okuno et al. ................ 438/776 |
| 6,136,654 | A | * | 10/2000 | Kraft et al. .................. 438/287 |
| 6,140,024 | A | | 10/2000 | Misium et al. .............. 430/314 |
| 6,372,581 | B1 | * | 4/2002 | Bensahel et al. ........... 438/287 |
| 6,444,592 | B1 | * | 9/2002 | Ballantine et al. .......... 438/758 |

FOREIGN PATENT DOCUMENTS

| JP | PUPA 59-55024 | 3/1984 |
| JP | PUPA 63-300518 | 12/1988 |
| JP | PUPA 10-12612 | 1/1998 |
| JP | PUPA 10-173187 | 6/1998 |
| JP | PUPA 2001-85427 | 3/2001 |
| JP | PUPA 2002-110674 | 4/2002 |

OTHER PUBLICATIONS

Lucovsky, G., "Ultrathin Nitrided Gate Dielectrics: Plasma Processing, Chemical Characterization, Performance and Reliability," IBM Journal of Research & Development, vol. 43, No. 3, 1999, pp. 1–27.

Gusev, E.P.; Lu, H.C.; Garfunkel, E. L.; Gustafsson, T.; and Green, M. L., "Growth and Characterization of Ultrathin Nitrided Silicon Oxide Film," IBM Journal of Research and Development, vol. 43, No. 3, 1999, pp. 1–22.

* cited by examiner

Primary Examiner—George Fourson
Assistant Examiner—Fernando L. Toledo
(74) Attorney, Agent, or Firm—Margaret A. Pepper (57) ABSTRACT

A method for forming a gate dielectric for an integrated circuit device. In an exemplary embodiment of the invention, the method includes forming an initial oxynitride layer upon a substrate material, the oxynitride layer having an initial physical thickness. The initial oxynitride layer is then subjected to a plasma nitridation, the plasma nitridation resulting in final oxynitride layer having a final physical thickness.

7 Claims, 9 Drawing Sheets

UNIFORMITY OF GATE FILM

| | MEAN THICKNESS (nm) | σ |
|---|---|---|
| RPN of SiO$_2$ (Dry) | 1.74 | 0.287 |
| RPN of SiO$_2$ (Wet) | 1.68 | 0.115 |
| RTNO | 1.70 | 0.0293 |
| RTNO +RPN@ 550°C | 1.74 | 0.0246 |
| RTNO +RPN@ 750°C | 1.73 | 0.0296 |

METHOD FOR IMPROVED PLASMA NITRIDATION OF ULTRA THIN GATE DIELECTRICS

BACKGROUND

The present invention relates generally to semiconductor processing and, more particularly, to improved techniques for fabricating gate dielectrics.

As integrated circuits have become smaller and more densely packed, so have the dielectric layers of devices such as field effect transistors and capacitors. With the arrival of ULSI (Ultra Large Scale Integrated circuit) technology and gate dielectrics of less than 15 angstroms (Å) in thickness, the reliability of the dielectric material is of increasing importance.

Nitrogen doping, particularly Remote Plasma Nitridation (RPN), is a known technique for increasing the dielectric constant (and hence the unit capacitance) of silicon oxide dielectrics. An increased dielectric constant, $\in$, helps in reducing the amount of leakage current experienced as compared to an undoped silicon dioxide layer having the same capacitance. However, there are several associated drawbacks with conventional methods of plasma nitridation used in conjunction with gate thickness around 15 Å or less. First, a relatively strong dosage of nitrogen ($2.0\times10^{15}/cm^2$ or greater) introduced into an oxide layer by RPN causes additional growth of the layer. This may result in unacceptable gate dielectric thicknesses where it desired to maintain the physical thickness around 15–20 Å. In addition, the direct nitridation of a silicon oxide layer typically results in a non-uniform distribution of nitrogen atoms therewithin. As a result, the uneven growth of film at the interface during nitridation affects the overall uniformity of the film thickness.

Although additional unwanted growth of the gate dielectric may be curtailed by decreasing the dosage of the nitrogen atoms introduced during the plasma nitridation process, this comes at the expense of a lower dielectric constant and, thus, a higher leakage current per unit capacitance. A need, therefore, exists for an improved process for plasma nitridation which results in a higher nitrogen dosage in the dielectric, but does not substantially increase the dielectric thickness or sacrifice the uniformity of film thickness.

BRIEF SUMMARY

The above discussed and other drawbacks and deficiencies of the prior art are overcome or alleviated by a method for forming a gate dielectric for an integrated circuit device. In an exemplary embodiment of the invention, the method includes forming an initial oxynitride layer upon a substrate material, the oxynitride layer having an initial physical thickness. The initial oxynitride layer is then subjected to a plasma nitridation, the plasma nitridation resulting in final oxynitride layer having a final thickness. In one embodiment, the final physical thickness exceeds the initial physical thickness by less than 5 angstroms and is less than 20 angstroms. Finally, the final oxynitride layer has a nitrogen dosage of at least $2.0\times10^{15}$ atoms/cm².

In one embodiment, the initial oxynitride layer is formed upon the substrate by ionically implanting nitrogen atoms into the substrate. The substrate is then oxidized following the nitrogen atom implantation. In an alternative embodiment, the initial oxynitride layer is formed upon the substrate by rapid thermal nitric oxide (NO) deposition.

BRIEF DESCRIPTION OF THE DRAWINGS

Referring to the exemplary drawings wherein like elements are numbered alike in the several Figures:

FIGS. 1 (a)–(c) illustrate the steps of a known process of plasma nitridation of an oxide layer;

DETAILED DESCRIPTION

Figure 1A:
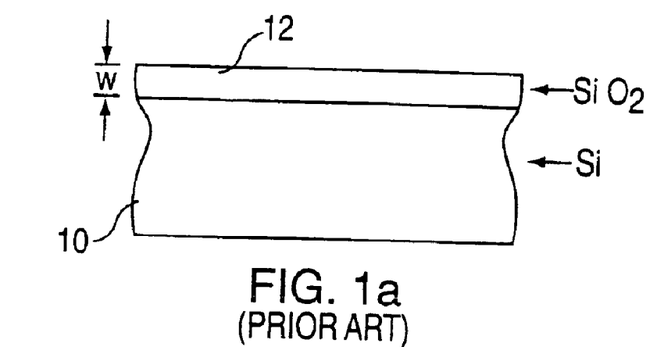
Figure 1B:
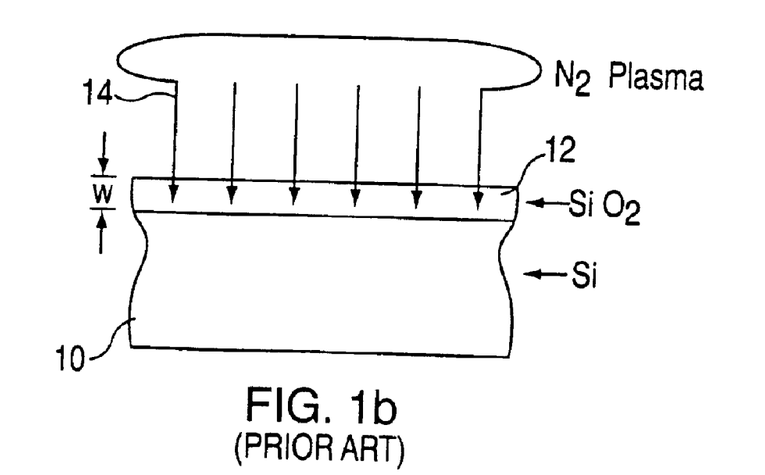
Figure 1C:
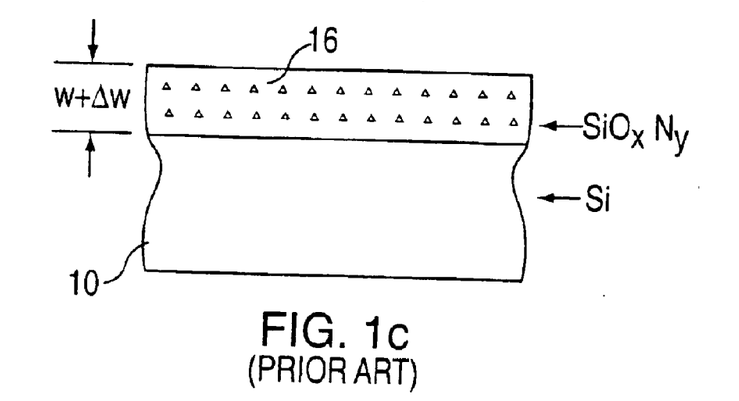

Referring initially to FIGS. 1(a) through 1(c), a known process of nitriding a gate oxide layer is illustrated. First, a silicon substrate 10 is subjected to oxidation, such as by heating the substrate 10 in a oxygenated environment, thereby forming an insulating oxide layer 12 of $SiO_2$. As discussed previously, the dielectric performance of the oxide layer 12 becomes increasingly important as gate thicknesses shrink into the deep sub-micron dimensions. In order to improve the dielectric constant of the oxide layer 12 to achieve lower leakage current per unit capacitance, excited nitrogen atoms are introduced into the oxide layer by a process known as Remote Plasma Nitridation (RPN), represented by lines 14 in FIG. 1(b). As a result of the RPN process, the oxide layer 12 is converted to a silicon oxynitride layer 16 having the general chemical composition $SiO_xN_y$, as shown in FIG. 1 (c).

While the oxynitride layer 16 has a higher dielectric constant than the oxide layer 12 (i.e., $\in SiO_2 \approx 3.9$, whereas $\in SiO_2N_y \approx 6.0$), the RPN process results in an increased physical, or measured thickness of the gate dielectric. For example, if the original oxide layer 12 shown in FIGS. 1(a) and 1(b) has an initial film physical thickness "w" of approximately 15 Å, the RPN process 14 applied thereto causes additional layer growth such that the change in gate film physical thickness "Δw" may be as much as 10–15 Å. Again, an unwanted increase in gate film physical thickness may be addressed by decreasing the dosage of the nitrogen atoms used in the RPN process. However, this comes at the expense of a lower dielectric constant, $\in SiO_2N_y$, and thus poorer performance.

Figure 2A:
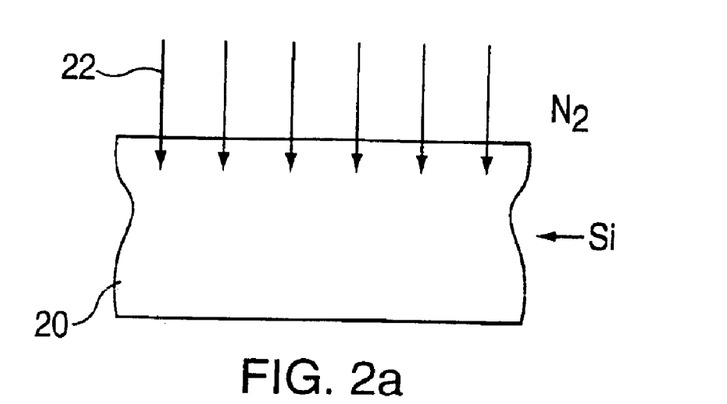
FIGS. 2(a)–(e) illustrate the steps of a method for forming a gate dielectric in accordance with an embodiment of the invention.
Figure 2B:
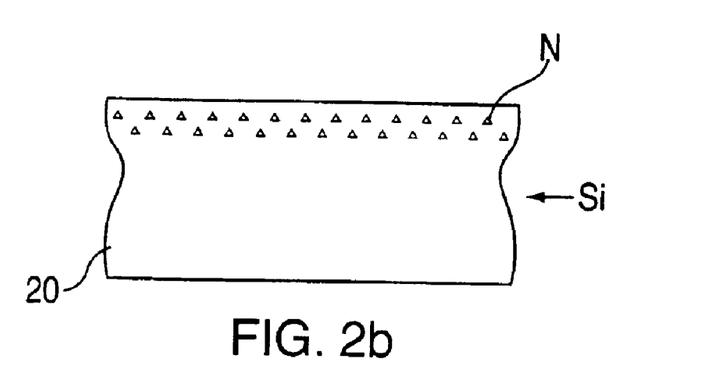
Figure 2C:
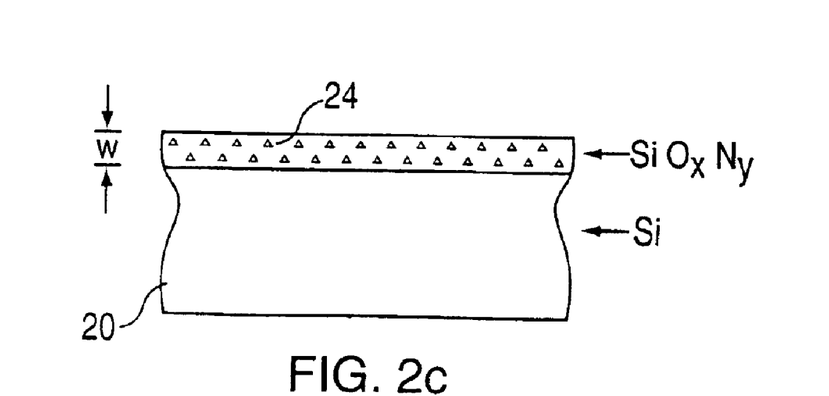

Referring now to FIGS. 2(a) through 2(e), a method of forming a gate dielectric, in accordance with an embodiment of the invention, is shown. Prior to oxidation, a silicon substrate 20 is first ionically implanted with nitrogen atoms, represented by lines 22 in FIG. 2(a). At an implantation energy of 11 KeV, the ionic implantation results in the substrate 20 having a dosage of nitrogen atoms N in the range of about $6.0\times10^{14}$ to $1.0\times10^{15}$ atoms/cm², shown in FIG. 2(b). Next, FIG. 2(c) illustrates the implanted substrate 20 after thermal oxidation, thereby forming an initial oxynitride layer 24 having an initial physical thickness "w".

Figure 2D:
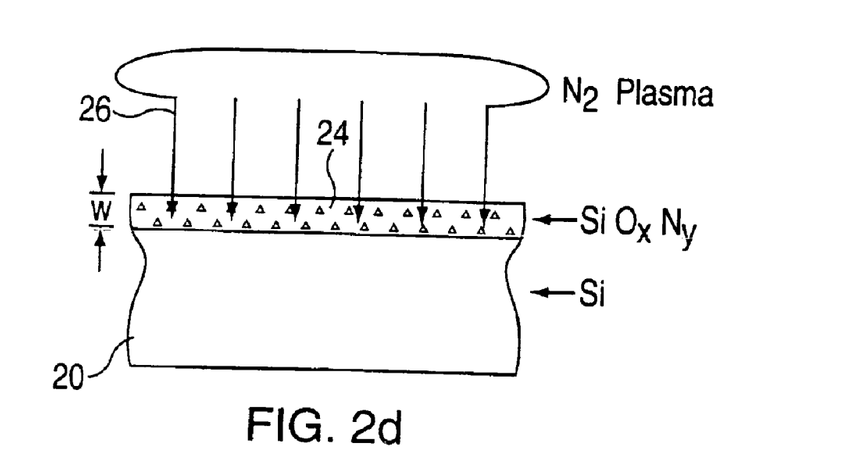

Once the initial oxynitride layer 24 is formed, the nitrogen dosage therein is thereafter increased by subjecting the initial oxynitride layer 24 to a plasma nitridation process, illustrated by lines 26 in FIG. 2(d). Plasma nitridation, including remote plasma nitridation (RPN), is a process wherein the reactive nitrogen species is excited such as by microwave excitation. The excited plasma is introduced into a plasma chamber (not shown) where the substrate and oxynitride layer 24 are exposed thereto. In remote plasma processing, the substrate is located outside the plasma generation region. Although RPN is the preferred method of nitridation in the present embodiments, it will be appreciated by those skilled in the art that conventional, or direct plasma processing may also be implemented.

Figure 2E:
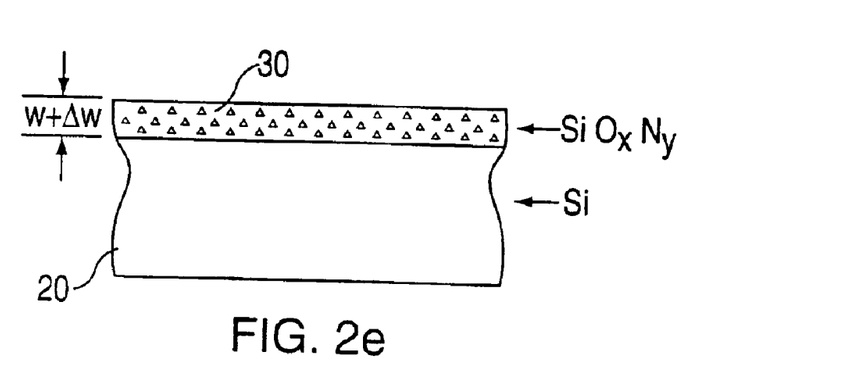

As a result of the RPN of the initial oxynitride layer 24, a final oxynitride layer 30 is formed, which preferably has an increased nitrogen concentration of at least $2.0 \times 10^{15}/cm^2$. Further, the final oxynitride layer 30 has a final physical thickness "w+$\Delta$w". (FIG. 2(e)), where $\Delta$w is approximately 2–5 Å. Thus, an ultra thin gate dielectric having an increased nitrogen dosage may be formed without a significant corresponding increase in the overall film physical thickness. Any additional growth of the initial oxynitride layer 24 depends upon the ability of the deposited or implanted material to penetrate the existing layer and reach the interface. Because a $SiO_xN_y$, layer has a higher density than that of a $SiO_2$ layer, it is relatively more difficult for the excited nitrogen species in plasma to penetrate all the way through to th interface and to generate growth of the layer. Therefore, a nitridation of an oxynitride layer will result in less additional growth of the layer than would be the case of an oxide layer.

The equivalent oxide thickness (EOT), or electrical thickness of a given gate dielectric is a relative measure of gate oxide thickness with respect to the actual physical thickness of an $SiO_2$ layer having the same capacitance value as the given gate dielectric. Since capacitance is directly proportional to the dielectric constant and inversely proportional to the thickness of the layer, it follows that an increase in dielectric constant allows for an increase in thickness in order to maintain the same capacitance. It has been found that the increase in dielectric constant as the result of plasma nitridation of the initial oxynitride layer 24 produces a final oxynitride layer 30 having an EOT of less than 15 Å.

Figure 3A:
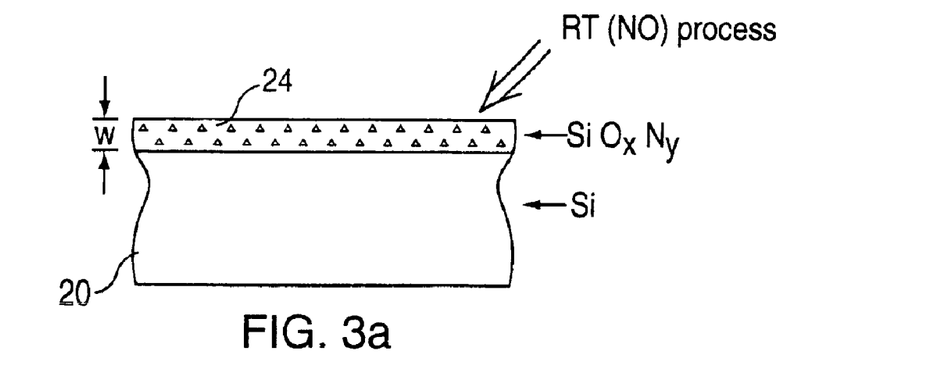
FIGS. 3(a)–(c) illustrate an alternative embodiment of the steps shown in FIGS. 2(a)–(e)
Figure 3B:
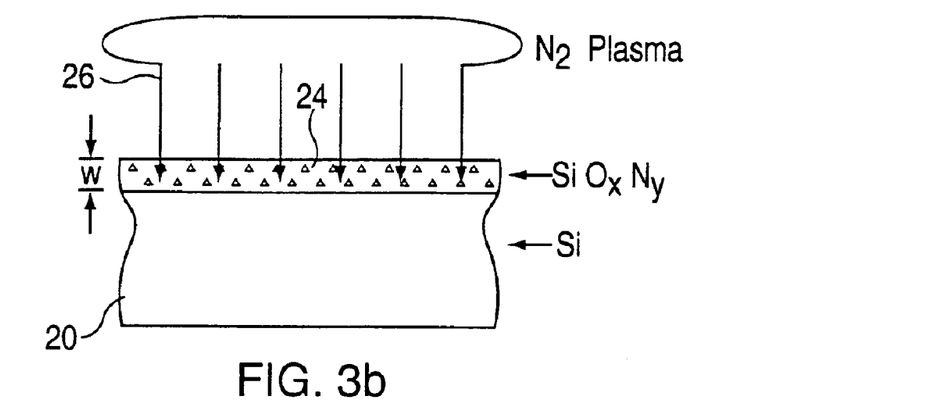
Figure 3C:
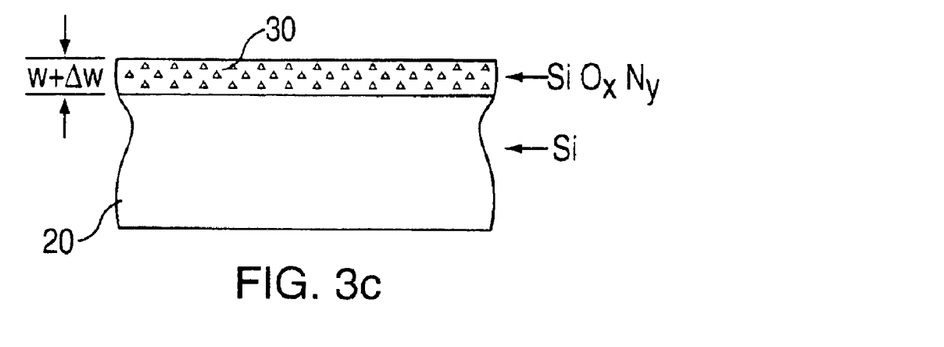

FIGS. 3(a) through 3(c) illustrate an alternative embodiment of the method shown in FIGS. 2(a) through 2(d). More specifically, FIG. 3(a) shows an alternative to nitrogen implantation and oxidation in forming the initial oxynitride layer 24. A single step may be performed in which the silicon substrate 20 is heated in a nitric oxide (NO) environment, also referred to as a Rapid Thermal NO (RTNO) process. Once the initial oxynitride layer 24 is prepared by RTNO, the RPN process (lines 26) is then carried out as shown in FIG. 3(b), again resulting in the final oxynitride layer 30 shown in FIG. 3(c). It should also be noted that the above-mentioned processes for forming the initial oxynitride layer 24 upon substrate 20 have been described by way of example only and are not meant in a limiting sense, as other means for forming the same are also possible.

Figure 4:
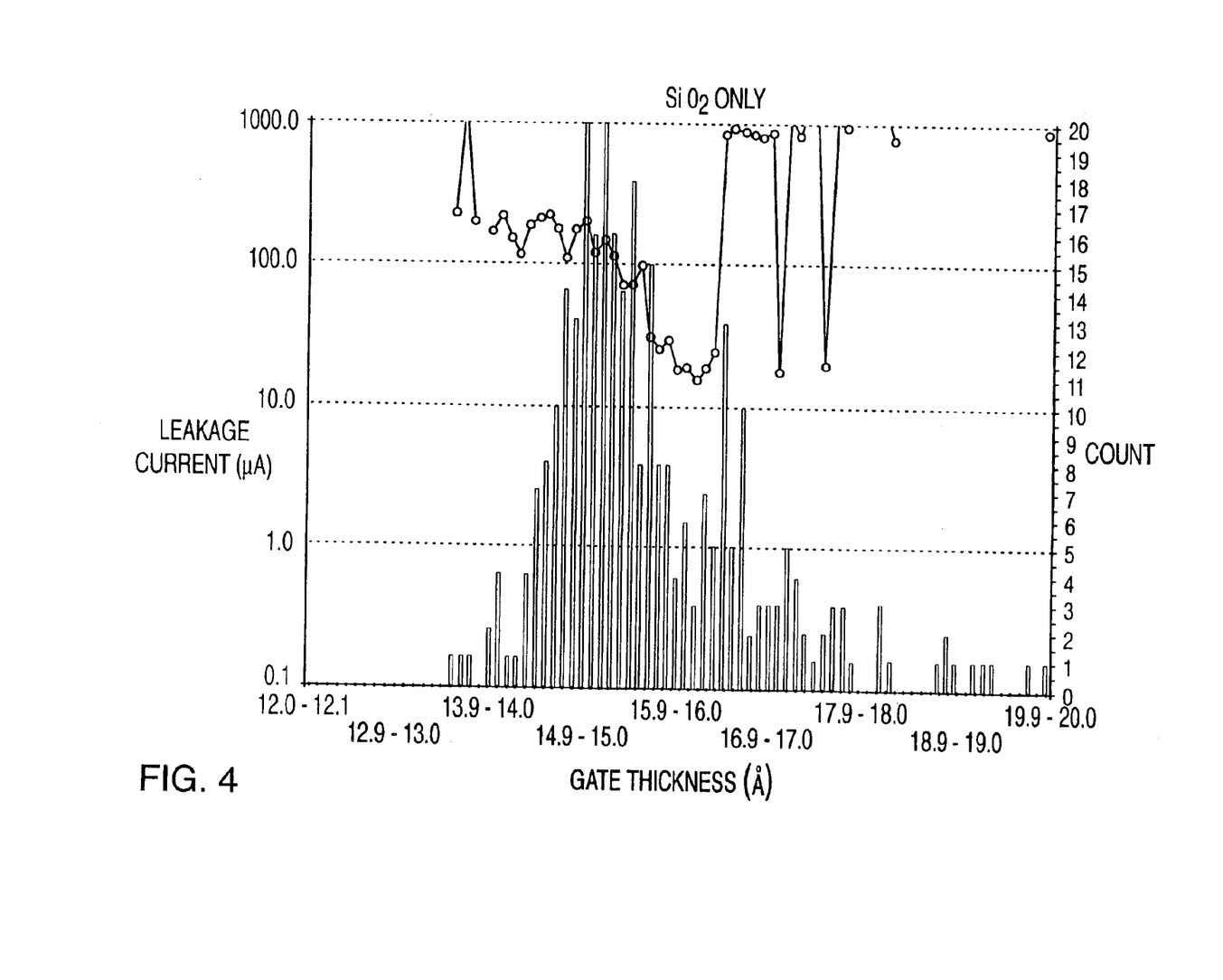
FIG. 4 is a histogram illustrating leakage current and equivalent oxide thickness for a population of gate dielectrics formed without nitridation.
Figure 5:
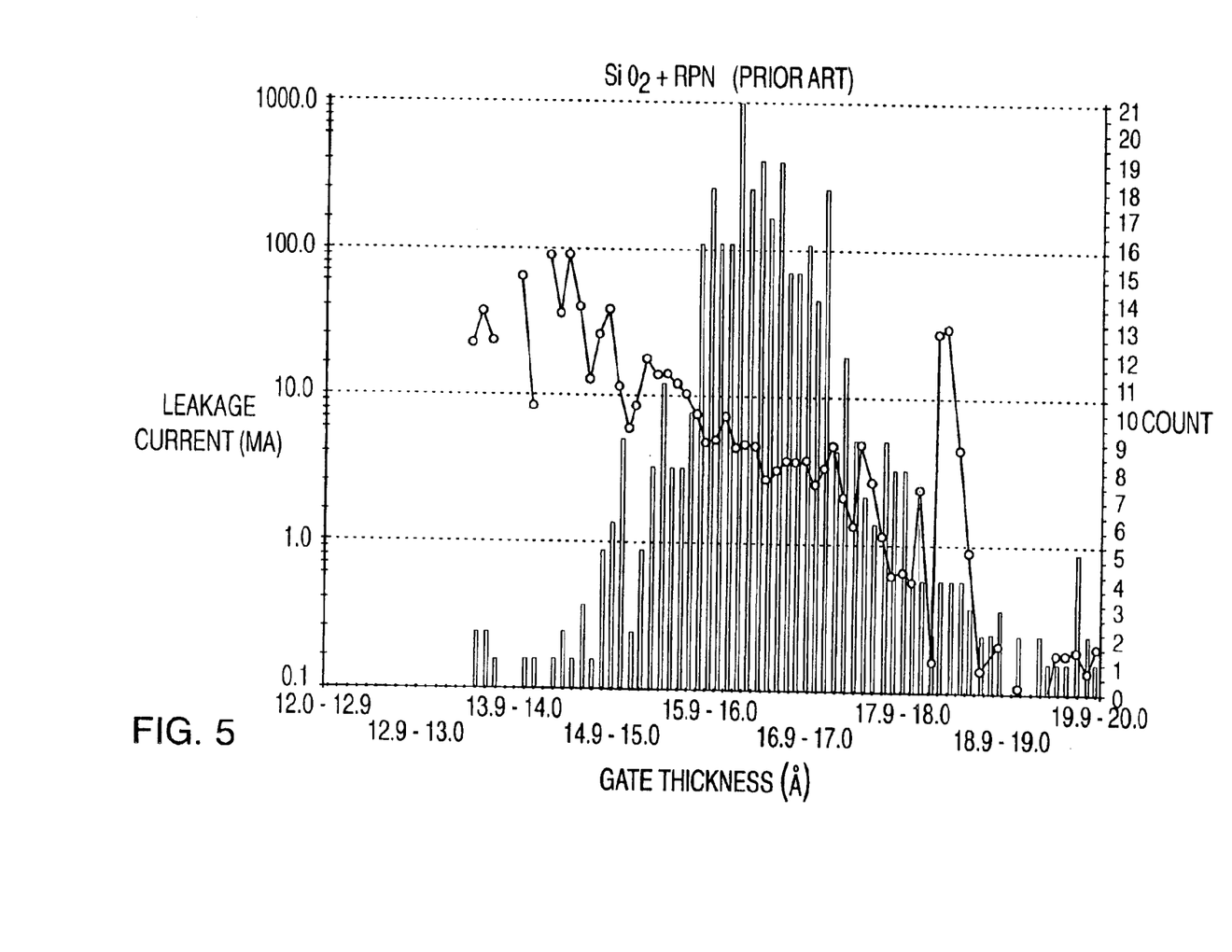
FIG. 5 is a histogram illustrating leakage current and equivalent oxide thickness for a population of gate dielectrics formed after nitridation of a pure oxide layer.
Figure 6:
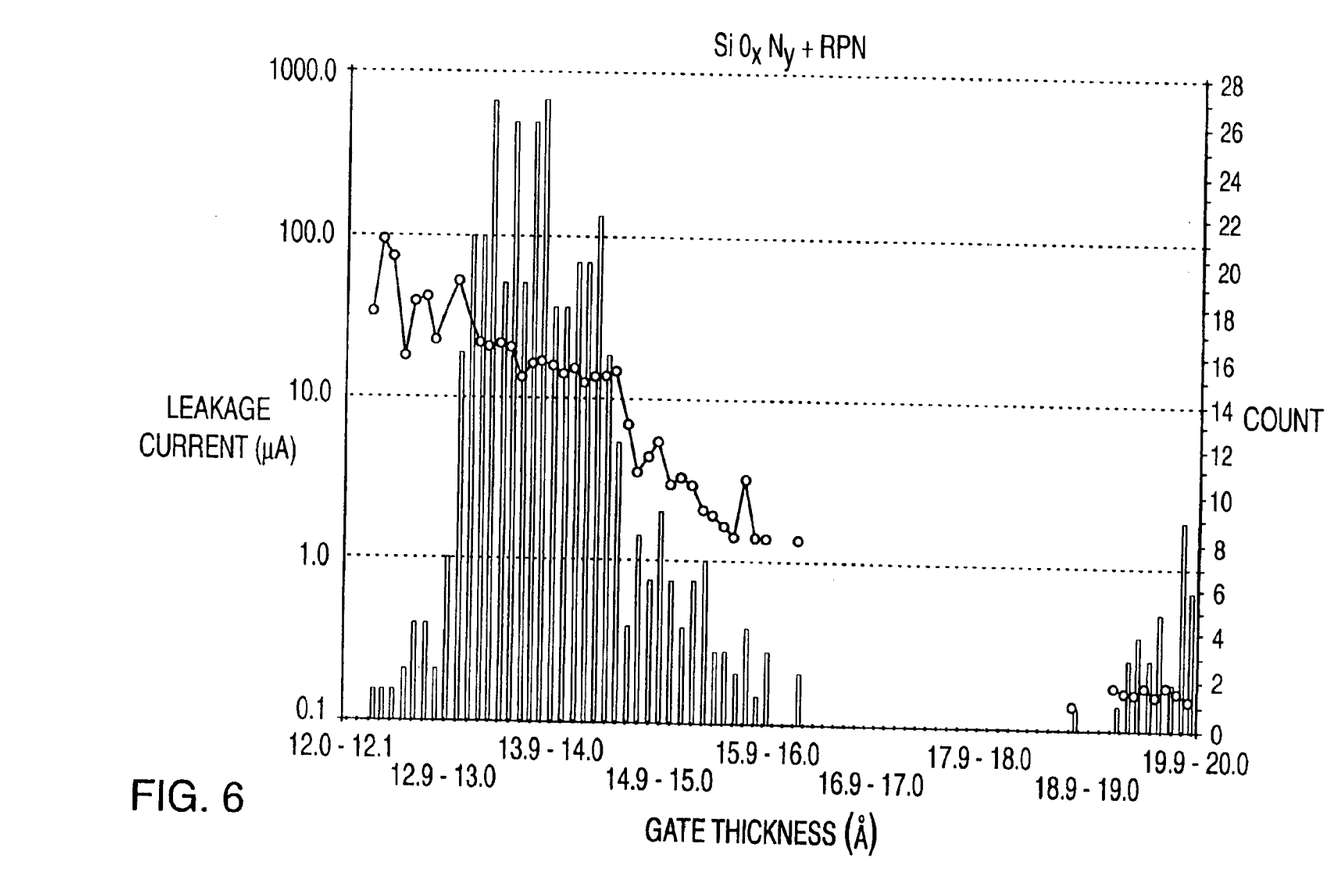
FIG. 6 is a histogram illustrating leakage current and equivalent oxide thickness for a population of gate dielectrics formed in accordance with an embodiment of the invention.

Referring generally now to FIGS. 4 through 6, a statistical comparison of gate dielectrics (formed with and without the above described methods) is illustrated. In particular, the histogram in FIG. 4 shows the frequency distribution for a population of gate dielectrics comprised of silicon dioxide ($SiO_2$) formed without any nitrogen doping. The statistical samples are grouped according to equivalent oxide thickness, which values range from approximately 13.6 Å to 20.0 Å. As can be seen, the mean EOT of the $SiO_2$ gate oxides is in the neighborhood of 15 Å. Although the EOTs of the $SiO_2$ layers might be in the desired range for ULSI circuitry, it can also be seen in FIG. 4 that these $SiO_2$ gates exhibit a relatively high leakage current that may be unacceptable for ultra thin gates. The mean leakage current for each gate (or gates) within an EOT interval is represented by a corresponding dot on the histogram.

FIG. 5 is another histogram for a population of gate dielectrics subjected to the RPN process without the formation of an oxynitride layer beforehand. As can be seen, there is a reduction in the mean leakage current of approximately tenfold for a given EOT range. On the other hand, the overall mean EOT of this population of gate dielectrics is now in the neighborhood of 16–17Å. Thus, although there is a marked improvement in the dielectric performance of the nitrided population by approximately one order of magnitude or greater, it is also seen that the mean EOT of the population has been increased. Furthermore, the plasma nitridation process, when applied directly to $SiO_2$, results in less uniformity of the film thickness, as is explained in further detail hereinafter.

In contrast, FIG. 6 illustrates a histogram for a population of gate dielectrics formed according to the above described methods. That is, the RPN process was applied only after an oxynitride layer was formed on a silicon substrate. As is evident from FIG. 6, nitridation in accordance with the above disclosed method results in even further improved dielectric performance over an undoped silicon oxide layer. Specifically, the mean leakage current for these dielectrics for a given EOT is reduced by approximately 30 to 50 times that of the $SiO_2$ layer and approximately 5 times that of the dielectrics of FIG. 5. Moreover, it is also seen that the overall mean EOT of the gate dielectrics is approximately 13–14.5 Å, reduced from the mean EOT of the gates nitrided without an initial oxynitride layer (FIG. 5).

Figure 7:
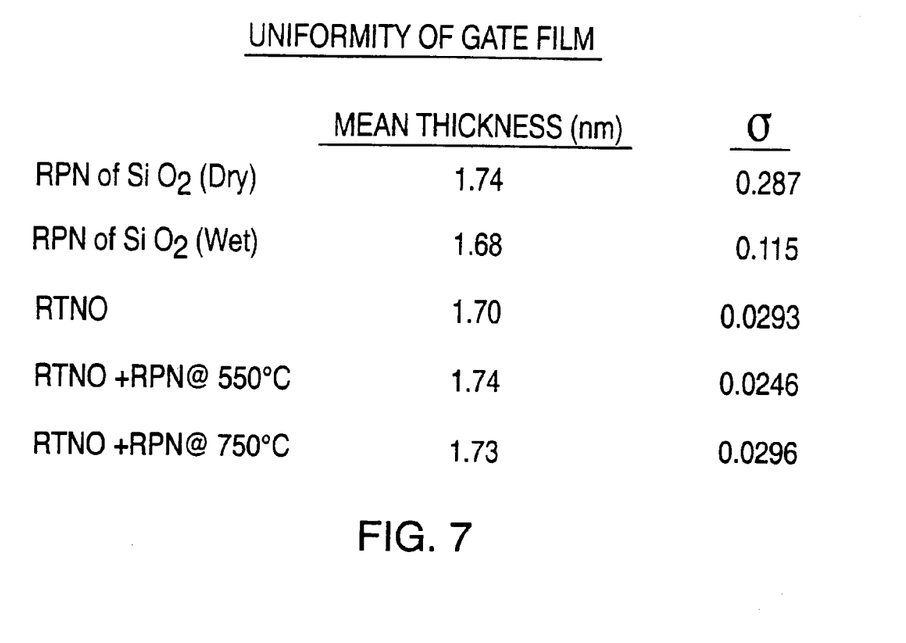
FIG. 7 is a table which illustrates statistical data on standard deviation of gate dielectric thicknesses.

FIG. 7 further demonstrates that the present methods result in an improved uniformity of gate film thickness. In the table shown, there is a comparison of the standard deviations (from the mean) for different processes of forming gate dielectrics having an average thickness of approximately 1.7 nanometers (17 Å). First, the nitridation of a $SiO_2$ gate population resulted in a standard deviation, $\sigma$, of 0.287 for dry oxides (formed in pure oxygen) and 0.115 for wet oxides (formed in hydrogen and oxygen). In contrast, an oxynitride layer formed with a rapid thermal NO process is inherently very uniform as the forming process is self-limiting. That is to say, in a RTNO process, any further penetration of gas to the interface after a certain thickness is attained will be resisted due to the increased thickness of the layer. After a certain time period, the NO gas will be unable to penetrate the oxynitride layer at a given RTNO process temperature. FIG. 7 further indicates that the oxynitride layer population having a mean thickness of 1.7 nanometers also had a standard deviation of just 0.0293.

Because of the nitrogen content already present in the oxynitride film, the further implementation of a plasma nitridation process does not materially affect the uniformity of the film samples. This is also reflected in FIG. 7, as a population of gate dielectrics with an initial oxynitride layer subjected to RPN at 550° C. had a standard deviation of 0.0246. Another population of gate dielectrics with an initial oxynitride layer subjected to RPN at 750° C. had a standard deviation of 0.0296.

Figure 8:
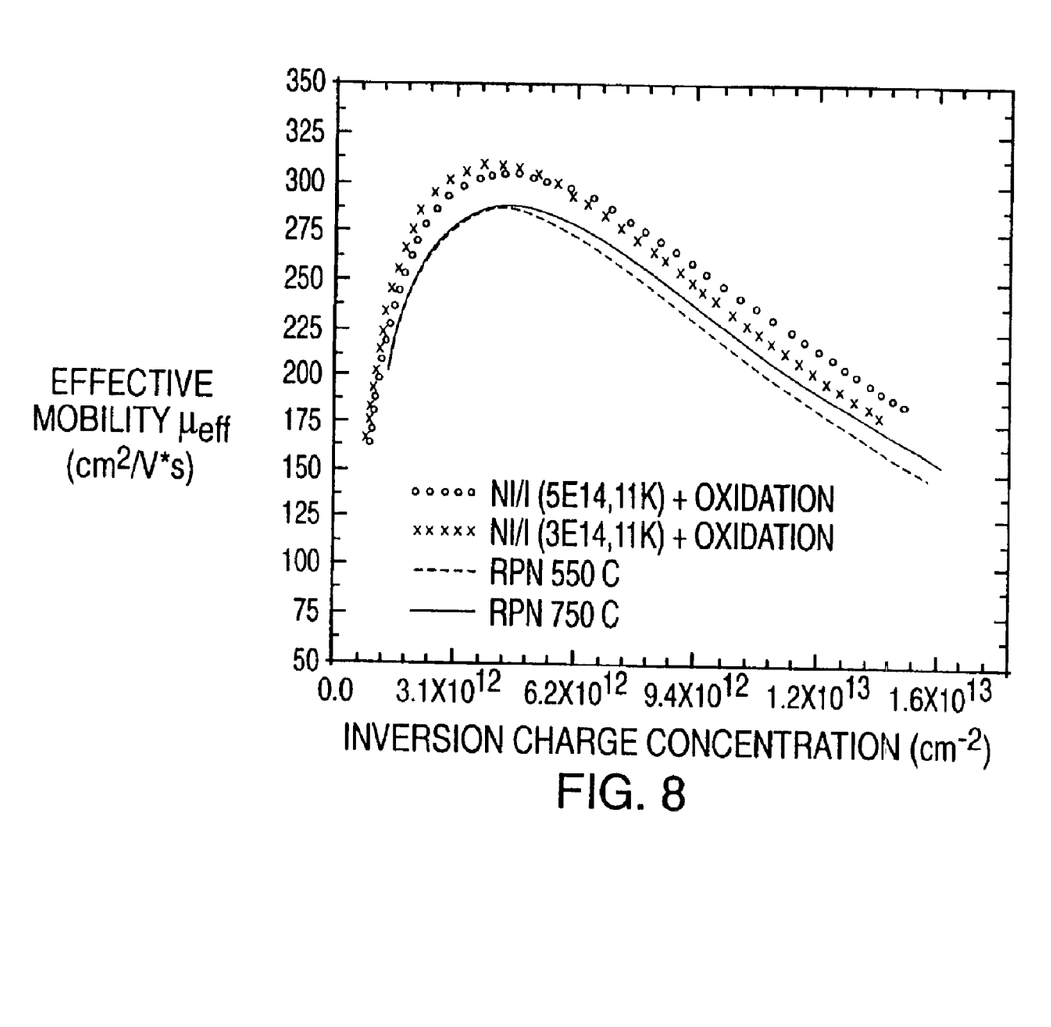
FIG. 8 is a graph comparing the electron mobility of various gate dielectrics.

Finally, FIG. 8 illustrates a comparison of the effective electron mobility in the silicon substrate inversion layer for differently fabricated dielectrics. Electron mobility relates to the speed of the device (i.e., how fast the carriers move). At low longitudinal fields (small electric fields in the plane of the substrate/insulator interface), the velocity of the electrons is proportional to the magnitude of the field itself. The proportionality constant is called the effective mobility, $\mu_{eff}$. Generally speaking, a plasma nitridation process used to form silicon oxynitride with a high nitrogen dosage can result in a significant decrease in the electron mobility in a gate dielectric. In gates conventionally formed with a silicon oxynitride layer having a high nitrogen dosage (i.e., RPN of an oxide layer), the effective mobility may be reduced by as much as 50–70%. However, in gate dielectrics nitrided in accordance with the disclosed embodiments, the effective mobility reduction is much less severe while still maintaining a thin oxynitride film containing a high nitrogen dosage.

As seen in FIG. 8, the effective mobility of a device varies with the electron sheet density (inversion charge concentration). The gate dielectrics formed only by oxidizing an nitrogen implanted substrate (i.e., the initial oxynitride layer 24 of FIG. 2(c)) generally had a peak effective mobility in the range of about 300 cm$^2$/V·s or more. On the other hand, those gate dielectrics formed accordance with the RPN of an oxynitride layer (i.e., the final oxynitride layer 30 of FIG. 2(e)) had a peak effective mobility in excess of 280 cm$^2$/V·s, and overall only about a 10–20% reduction in mobility at an inversion charge concentration of approximately 3.5×10$^{12}$ cm$^{-2}$ to 4.5×10$^{12}$ cm$^{-2}$.

Through the foregoing description, it is seen that by forming an initial oxynitride layer upon a substrate and then subjecting the initial oxynitride layer to a plasma nitridation, a final oxynitride gate layer is formed with improved dielectric properties and reduced thickness. As a further benefit, the initial oxynitride layer provides a good barrier against diffusion of excited nitrogen plasma into the substrate interface during the RPN process. Accordingly, the dielectric film remains relatively uniform, even after nitridation.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a gate dielectric for an integrated circuit device, the method comprising:

forming an initial heavily nitrided oxynitride layer upon a substrate material, said initial heavily nitrided oxynitride layer having an initial thickness; and subjecting said initial heavily nitrided oxynitride layer to a plasma nitridation, said plasma nitridation resulting in a final oxynitride layer, said final oxynitride layer having a final thickness, wherein said final oxynitride layer has an equivalent oxide thickness of less than 15 angstroms and a nitrogen dosage of at least 2.0×10$^{15}$ atoms/cm$^2$.

2. The method of claim 1, wherein said final thickness exceeds said initial thickness by less than 5 angstroms.

3. The method of claim 1, wherein said final thickness is less than 20 angstroms.

4. The method of claim 1, wherein said initial heavily nitrided oxynitride layer is formed upon said substrate by:

ionically implanting nitrogen atoms into said substrate; and oxidizing said substrate, following said substrate being ionically implanted with nitrogen atoms.

5. The method of claim 1, wherein said initial heavily nitrided oxynitride layer is formed upon said substrate by rapid thermal nitric oxide (NO) deposition.

6. The method of claim 4, wherein said final oxynitride layer further has a reduction in effective electron mobility, $\mu_{eff}$, of less than 20% from the effective electron mobility of said initial oxynitride layer.

7. The method of claim 4, wherein said ionic implantation results in said substrate having a nitrogen dosage of about 6.0×10$^{14}$ to 1.0×10$^{15}$ atoms/cm$^2$.

* * * * *